(12) United States Patent
Guo et al.

(10) Patent No.: US 12,706,277 B2
(45) Date of Patent: Aug. 11, 2026

(54) RADIO-FREQUENCY (RF) MATCHING NETWORK AND TUNING TECHNIQUE

(71) Applicant: Applied Materials, Inc., Santa Clara, CA (US)

(72) Inventors: Yue Guo, Redwood City, CA (US); Kartik Ramaswamy, San Jose, CA (US); A N M Wasekul Azad, Santa Clara, CA (US); Nicolas J. Bright, Arlington, WA (US); Yang Yang, San Diego, CA (US)

(73) Assignee: Applied Materials, Inc., Santa Clara, CA (US)

( * ) Notice: Subject to any disclaimer, the term of this patent is extended or adjusted under 35 U.S.C. 154(b) by 175 days.

(21) Appl. No.: 18/244,202

(22) Filed: Sep. 8, 2023

(65) Prior Publication Data

US 2025/0087462 A1 Mar. 13, 2025

(51) Int. Cl.
*H01J 37/32* (2006.01)
*H10P 72/00* (2026.01)

(52) U.S. Cl.
CPC .. *H01J 37/32183* (2013.01); *H01J 37/32935* (2013.01); *H01J 37/3299* (2013.01);
(Continued)

(58) Field of Classification Search
CPC ........................................................ H01J 37/32
See application file for complete search history.

(56) References Cited

U.S. PATENT DOCUMENTS 5,350,479 A * 9/1994 Collins .................. H10P 72/72 279/128
5,477,975 A * 12/1995 Rice ................. H01J 37/32871 438/909

(Continued)

FOREIGN PATENT DOCUMENTS

EP 2877864 A2 6/2015
KR 101978353 B1 5/2019

(Continued)

OTHER PUBLICATIONS

International Search Report and Written Opinion for International Application No. PCT/US2024/041760 dated Dec. 4, 2024.

(Continued)

*Primary Examiner* — Srinivas Sathiraju
(74) *Attorney, Agent, or Firm* — Patterson + Sheridan, LLP

(57) ABSTRACT

Embodiments provided herein generally include apparatus, plasma processing systems and methods for tuning in a radio frequency (RF) plasma processing system for improving substrate processing metrics. Some embodiments are directed to a method for processing a substrate in a plasma processing system. The method generally includes: sensing, via one or more sensors, one or more intermodulation or harmonic components of a signal at a node coupled to a plasma chamber; and controlling one or more signal processing devices of the plasma processing system to process the substrate based on the one or more intermodulation or harmonic components and in accordance with a frequency domain configuration identified by analyzing one or more substrate processing metrics.

21 Claims, 8 Drawing Sheets

(52) U.S. Cl.
CPC .... *H10P 72/0421* (2026.01); *H01J 37/32091* (2013.01); *H01J 2237/334* (2013.01)

(56) References Cited

U.S. PATENT DOCUMENTS 5,539,609 A * 7/1996 Collins ................. H10P 72/722 361/234
6,095,741 A * 8/2000 Kroeker .............. H10P 72/0464 414/217
6,251,770 B1 * 6/2001 Uglow ................ H10W 20/071 438/638
6,267,545 B1 * 7/2001 Mooring ............. H10P 72/0464 414/217
7,190,119 B2 * 3/2007 Patrick ................ H01J 37/3299 315/111.21
9,111,727 B2 * 8/2015 Zhao ................. H01J 37/32256
9,578,731 B2 * 2/2017 Van Zyl ........... H01J 37/32935
9,620,334 B2 * 4/2017 Lyndaker ................. H03H 7/40
9,831,899 B1 * 11/2017 Boghrat ................ H03F 1/3247
9,854,659 B2 * 12/2017 Van Zyl ........... H01J 37/32082
10,194,518 B2 * 1/2019 Van Zyl ........... H01J 37/32082
10,267,728 B2 * 4/2019 Yang ....................... G01J 3/443
10,283,330 B2 * 5/2019 Marakhtanov ...... H01J 37/3299
10,304,669 B1 * 5/2019 Coumou ........... H01J 37/32174
10,340,122 B2 * 7/2019 Chen ................ H01J 37/32082
10,354,841 B2 * 7/2019 Zhao ................. H01J 37/32568
10,381,201 B2 * 8/2019 Lyndaker .......... H01J 37/32082
10,395,895 B2 * 8/2019 Coumou ........... H01J 37/32155
10,432,248 B1 * 10/2019 Hanks ....................... H03F 1/56
10,692,698 B2 * 6/2020 Coumou ........... H01J 37/32091
11,042,140 B2 * 6/2021 Coumou .............. G05B 19/042
11,232,931 B2 * 1/2022 Huh ........................ H05H 1/46
11,439,681 B2 * 9/2022 Ai .......................... A61K 36/07
11,804,362 B2 * 10/2023 Van Zyl ........... H01J 37/32183
12,111,341 B2 * 10/2024 Guo ................. H01J 37/32935
12,125,679 B2 * 10/2024 Koshimizu ....... H01J 37/32183
12,217,937 B2 * 2/2025 Khaja ............... H01J 37/32183
2002/0034191 A1 * 3/2002 Shattil ................. H04L 27/2601 370/464
2004/0119468 A1 * 6/2004 Gotkis .................. H10P 74/238 702/170
2004/0213351 A1 * 10/2004 Shattil ................. H04L 27/2614 375/260
2005/0066739 A1 * 3/2005 Gotkis .................... B24B 49/16 73/760
2005/0264218 A1 * 12/2005 Dhindsa ............ H01J 37/32174 315/111.21
2006/0256499 A1 * 11/2006 Yang ................. H01J 37/32706 361/234
2007/0127188 A1 * 6/2007 Yang ................. H01J 37/32706 361/234
2010/0136793 A1 * 6/2010 Chen ................ H01J 37/32165 156/345.28
2013/0109187 A1 * 5/2013 Nemani ............. H10W 20/081 156/345.1
2014/0195033 A1 * 7/2014 Lyndaker .......... H01J 37/32183 700/121
2015/0241555 A1 * 8/2015 Lin ...................... A61B 5/7257 702/56
2016/0111259 A1 * 4/2016 Van Zyl ........... H01J 37/32935 315/111.21
2016/0113103 A1 * 4/2016 Van Zyl ................... H05H 1/46 315/111.21
2016/0126064 A1 * 5/2016 Yamawaku .......... H01J 37/3211 315/111.21
2016/0215883 A1 * 7/2016 Nguyen ............ H01J 37/32899
2016/0307738 A1 * 10/2016 Marakhtanov .... H01J 37/32183
2017/0062186 A1 * 3/2017 Coumou ........... H01J 37/32165
2017/0178758 A1 * 6/2017 Ha ........................ C23C 16/448
2017/0194130 A1 * 7/2017 Lyndaker ............... G05B 17/02
2017/0214378 A1 * 7/2017 Black ....................... H01Q 5/50
2017/0330730 A1 11/2017 Kubota
2017/0347442 A1 * 11/2017 Suzuki ............. H01J 37/32449
2018/0005802 A1 * 1/2018 Chen ................ H01J 37/32174
2018/0077788 A1 * 3/2018 Van Zyl ................... H05H 1/46
2018/0206757 A1 * 7/2018 Goodwill ............. A61B 5/0515
2019/0108976 A1 * 4/2019 Van Zyl ............ H01J 37/32146
2019/0115188 A1 * 4/2019 Yamawaku .......... H01J 37/3211
2019/0288737 A1 * 9/2019 Hanks ...................... H04B 1/44
2019/0318919 A1 * 10/2019 Lyndaker .......... H01J 37/32935
2019/0333738 A1 * 10/2019 Coumou ............... H01J 37/321
2019/0391547 A1 * 12/2019 Coumou .............. G05B 19/042
2020/0066493 A1 * 2/2020 Noorbakhsh ..... H01J 37/32082
2020/0395905 A1 * 12/2020 Schober .............. H03F 3/45183
2020/0411286 A1 * 12/2020 Koshimizu ....... H01J 37/32128
2021/0027992 A1 * 1/2021 Funk ....................... H03F 3/602
2021/0066040 A1 * 3/2021 Kubota ............... H01J 37/3299
2021/0118649 A1 * 4/2021 Huh .................. H01J 37/32183
2021/0166917 A1 * 6/2021 Van Zyl ................... H03H 7/40
2021/0175050 A1 * 6/2021 Van Zyl ............ H01J 37/32174
2021/0287880 A1 * 9/2021 Van Zyl ............ H01J 37/32183
2021/0305030 A1 * 9/2021 Tsujimoto ......... H01J 37/32183
2021/0327681 A1 * 10/2021 Koshimizu ....... H01J 37/32128
2021/0330730 A1 * 10/2021 Ai .......................... A61K 36/07
2021/0335577 A1 * 10/2021 Tanaka ............. H01J 37/32183
2021/0343504 A1 * 11/2021 Funk ....................... H03F 3/602
2022/0102116 A1 * 3/2022 Huh .................. H01J 37/32183
2022/0130642 A1 * 4/2022 Kawasaki ......... H01J 37/32183
2022/0165545 A1 * 5/2022 Burry ............... H01J 37/32155
2022/0216036 A1 * 7/2022 Koshimizu ....... H01J 37/32128
2022/0359161 A1 11/2022 Guo et al.
2022/0399186 A1 * 12/2022 Cui .................. H01J 37/32146
2022/0399189 A1 * 12/2022 Guo .................. H01J 37/32183
2022/0406567 A1 * 12/2022 Yang ................. H01J 37/32128
2022/0415614 A1 * 12/2022 Yang ................. H01J 37/32091
2023/0041177 A1 * 2/2023 Smyka .............. H01J 37/32155
2023/0049104 A1 * 2/2023 Burry ............... H01J 37/32155
2023/0087307 A1 * 3/2023 Guo .................. H01J 37/32183 315/111.21
2023/0094655 A1 * 3/2023 Koshimizu ......... H01J 37/3244 315/111.21
2023/0170192 A1 * 6/2023 Guo .................. H01J 37/32091 156/345.28
2023/0170194 A1 * 6/2023 Guo .................. H01J 37/32174 438/711
2023/0178337 A1 * 6/2023 Kozakevich ...... H01J 37/32165 216/67
2023/0187176 A1 * 6/2023 Ramaswamy .... H01J 37/32091 438/798
2023/0187189 A1 * 6/2023 Jung ..................... C23C 16/509 219/121.59
2023/0207294 A1 * 6/2023 Jin .................... H01J 37/32155 156/345.28
2023/0326721 A1 * 10/2023 Smyka .............. H01J 37/32155 315/111.21
2023/0343555 A1 * 10/2023 Guo .................. H01J 37/32146
2023/0377843 A1 * 11/2023 Koshimizu ....... H01J 37/32128
2024/0079212 A1 * 3/2024 Guo .................. H01J 37/32183
2024/0118328 A1 * 4/2024 Guo .................. H01J 37/32917
2024/0152114 A1 * 5/2024 Guo .................. H01J 37/32183
2024/0177968 A1 * 5/2024 Azad ................. H01J 37/32146
2024/0194447 A1 * 6/2024 Guo .................. H01J 37/32128
2024/0290578 A1 * 8/2024 Ramaswamy ........ H01J 37/321
2024/0304418 A1 * 9/2024 Koshimizu ....... H01J 37/32174
2024/0363311 A1 * 10/2024 Luo ................... H01J 37/32174
2024/0371605 A1 * 11/2024 Guo .................. H01J 37/32183
2024/0412947 A1 * 12/2024 Guo .................. H01J 37/32183
2025/0087462 A1 * 3/2025 Guo .................. H01J 37/32183

FOREIGN PATENT DOCUMENTS

KR 20230100087 A 7/2023
TW 202247279 A 12/2022
WO WO-2021202129 A1 * 10/2021 ........ H01J 37/32935
WO WO-2024233031 A1 * 11/2024 ........ H01J 37/32174
WO WO-2024253754 A1 * 12/2024 ........ H01J 37/32146

OTHER PUBLICATIONS

Taiwanese Office Action for Application No. 113130651 dated Mar. 11, 2026.

(56) References Cited

OTHER PUBLICATIONS

Korean Office Action for Application No. 10-2025-7035394 dated Apr. 16, 2026.

* cited by examiner

RADIO-FREQUENCY (RF) MATCHING NETWORK AND TUNING TECHNIQUE

BACKGROUND

Field

Embodiments of the present invention generally relate to a system and methods used in semiconductor device manufacturing. More specifically, embodiments of the present disclosure relate to a plasma processing system used to process a substrate.

Description of the Related Art

Reliably producing high aspect ratio features is one of the key technology challenges for the next generation of semiconductor devices. One method of forming high aspect ratio features uses a plasma assisted etching process, such as a reactive ion etch (RIE) plasma process, to form high aspect ratio openings in a material layer, such as a dielectric layer, of a substrate. In a typical RIE plasma process, a plasma is formed in a processing chamber and ions from the plasma are accelerated towards a surface of a substrate to form openings in a material layer disposed beneath a mask layer formed on the surface of the substrate.

A typical RIE plasma processing chamber includes a radio frequency (RF) bias generator, which supplies an RF voltage to a power electrode. In a capacitive coupled gas discharge, the plasma is created by using an RF generator that is coupled to the power electrode that is disposed within an electrostatic chuck (ESC) assembly or within another portion of the processing chamber. Typically, an RF matching network ("RF match") tunes an RF waveform provided from the RF generator to deliver RF power to an apparent load of 50Ω to minimize the reflected power and maximize the power delivery efficiency. If an impedance of the load is not properly matched to an impedance of a source (e.g., the RF generator), a portion of the forward delivered RF waveform can reflect back in an opposite direction along a same transmission line.

Therefore, there is a need for an apparatus and method for processing a substrate in a plasma processing system that solves the problems described above.

SUMMARY

Embodiments provided herein generally include apparatus, plasma processing systems and methods for tuning in a radio frequency (RF) plasma processing system for improving substrate processing metrics.

Some embodiments are directed to a method for processing a substrate in a plasma processing system. The method generally includes: sensing, via one or more sensors, one or more intermodulation or harmonic components of a signal at a node coupled to a plasma chamber; and controlling one or more signal processing devices of the plasma processing system to process the substrate based on the one or more intermodulation or harmonic components and in accordance with a frequency domain configuration identified by analyzing one or more substrate processing metrics.

Some embodiments are directed to an apparatus for processing a substrate in a plasma processing system. The apparatus generally includes: one or more sensors configured to sense one or more intermodulation or harmonic components of a signal at a node coupled to a plasma chamber; one or more signal processing devices coupled to the plasma chamber; and a controller configured to control the one or more signal processing devices of the plasma processing system to process the substrate based on the one or more intermodulation or harmonic components and in accordance with a frequency domain configuration identified by analyzing one or more substrate processing metrics.

Some embodiments are directed to a plasma processing system, including: a plasma chamber; one or more sensors configured to sense one or more intermodulation or harmonic components of a signal at a node coupled to the plasma chamber; one or more signal processing devices coupled to the plasma chamber; and a controller configured to control the one or more signal processing devices of the plasma processing system to process the substrate based on the one or more intermodulation or harmonic components and in accordance with a frequency domain configuration identified by analyzing one or more substrate processing metrics.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a system used in a semiconductor device manufacturing process. More specifically, embodiments provided herein generally include apparatus and methods for tuning a radio frequency (RF) plasma processing system to provide, modify and/or control the delivery, generation and/or application of intermodulation and harmonic components created during plasma processing. For example, a frequency domain configuration (e.g., magnitude or phase associated with one or more intermodulation and harmonic components) may be identified to meet certain substrate processing metrics (e.g., improve etch rate, decrease process variation, and/or uniformity). The processing system may be implemented with a sensor that measures intermodulation and harmonic components of signal during substrate processing. Based on the measured intermodulation and harmonic components, one or more processing components (e.g., one or more match circuits, pulsed voltage (PV) waveform generator, and/or radio frequency (RF) generator) may be controlled in accordance with the identified frequency domain configuration. For instance, the frequency domain configuration may include a ratio between signal magnitudes at select frequencies (e.g., select intermodulation or harmonic components) that improves substrate processing metrics (also referred to herein as "wafer results"). The one or more processing components used to process a substrate may be controlled to generate signaling to drive the processing chamber in accordance with the ratio between the signal magnitudes at the select frequencies.

Plasma Processing System Examples

Figure 1A:
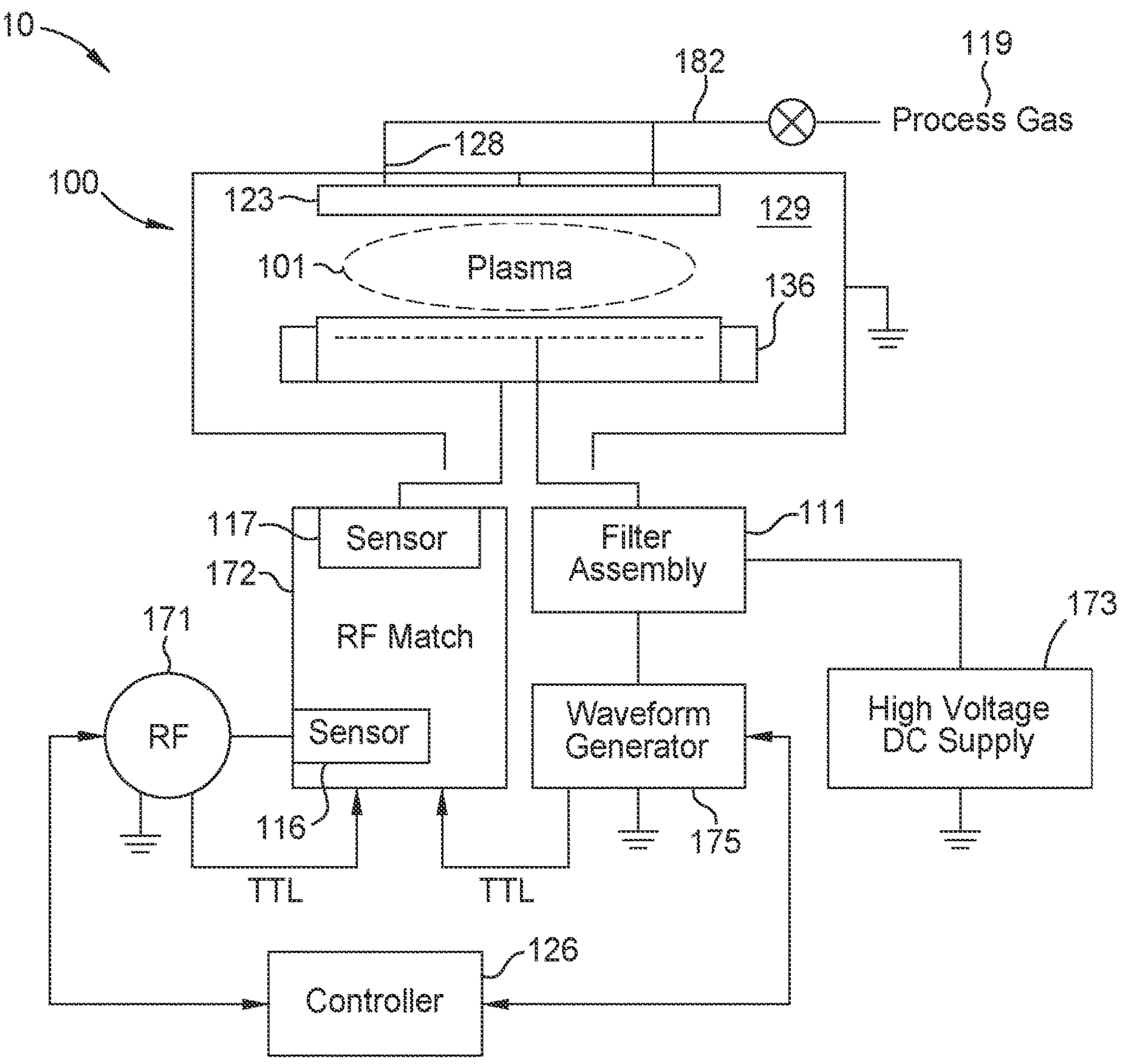
FIG. 1A is a schematic representation of a plasma processing system, in accordance with certain embodiments of the present disclosure.

FIG. 1A is a schematic representation of a plasma processing system. The plasma processing system 10 is configured for plasma-assisted etching processes, such as a reactive ion etch (RIE) plasma processing. The plasma processing system 10 can also be used in other plasma-assisted processes, such as plasma-enhanced deposition processes (for example, plasma-enhanced chemical vapor deposition (PECVD) processes, plasma-enhanced physical vapor deposition (PEPVD) processes, plasma-enhanced atomic layer deposition (PEALD) processes, plasma treatment processing, plasma-based ion implant processing, or plasma doping (PLAD) processing. In one configuration, as shown in FIG. 1A, the plasma processing system 10 is configured to form a capacitive coupled plasma (CPP). However, in some embodiments, a plasma may alternately be generated by an inductively coupled source disposed over a processing region of the plasma processing system 10.

The plasma processing system 10 includes a processing chamber 100, a substrate support assembly 136, a gas delivery system 182, a high DC voltage supply 173, a radio frequency (RF) generator 171, and an RF match 172 (e.g., RF impedance matching network). A chamber lid 123 includes one or more sidewalls and a chamber base that are configured to withstand the pressures and energy applied to them while a plasma 101 is generated within a vacuum environment maintained in a processing volume 129 of the processing chamber 100 during processing.

The gas delivery system 182, which is coupled to the processing volume 129 of the processing chamber 100 is configured to deliver at least one processing gas from at least one gas processing source 119 to the processing volume 129 of the processing chamber 100. The gas delivery system 182 includes the processing gas source 119 and one or more gas inlets 128 positioned through the chamber lid 123. The gas inlets 128 are configured to deliver one or more processing gasses to the processing volume 129 of the processing chamber 100.

The processing chamber 100 includes an upper electrode (e.g., the chamber lid 123) and a lower electrode (e.g., the substrate support assembly 136) positioned in the processing volume 129 of the processing chamber 100. The upper and lower electrodes face one another. In one embodiment, the RF generator 171 is electrically coupled to the lower electrode. The RF generator 171 is configured to deliver an RF signal to ignite and maintain the plasma 101 between the upper and lower electrodes. In some alternative configurations, the RF generator 171 can also be electrically coupled to the upper electrode. For example, the RF generator 171 may deliver an RF source power to an RF baseplate within a cathode assembly (e.g., in the substrate support assembly 136) for plasma production, whereas the upper electrode is grounded. A center frequency of the RF source power can be from 13.56 MHz to very high frequency band such as 40 MHz, 60 MHz, 120 MHz or 162 MHz. In some examples, the RF source power can also be delivered through the upper electrode. The RF source power can be operated in a continuous mode or a pulsed mode. A pulsing frequency of the RF power can be from 100 to 10 kHz, and duty cycles are ranging from 5% to 95%. The RF generator 171 has a frequency tuning capability and can adjust its RF power frequency within e.g., ±5% or ±10%. In some embodiments, the RF generator 171 switches the RF power frequency at a predefined speed (e.g., two nanoseconds, fifty nanoseconds, etc.).

The substrate support assembly 136 may be coupled to a high voltage DC supply 173 that supplies a chucking voltage thereto. The high voltage DC supply 173 may be coupled to a filter assembly 178 that is disposed between the high DC voltage supply 173 and the substrate support assembly 136.

The filter assembly 178 is configured to electronically isolate the high voltage DC supply 173 during plasma processing. In one configuration, a static DV voltage is between about −5000V and about 5000V, and is delivered using an electrical conductor (such as a coaxial power delivery line). The filter assembly 178 may include multiple filtering components or a single common filter.

The substrate support assembly 136 is coupled to a pulsed voltage (PV) waveform generator 175 configured to supply a PV to bias the substrate support assembly 136. The PV waveform generator 175 is coupled to the filter assembly 178. The filter assembly 178 is disposed between the PV waveform generator 175 and the substrate support assembly 136. The filter assembly 178 is configured to electronically isolate the PV waveform generator 175 during plasma processing.

The substrate support assembly 136 is coupled to the RF generator 171 configured to deliver an RF signal to the processing volume 129 of the processing chamber 100. The RF generator 171 is electronically coupled to the RF match 172 disposed between the RF generator 171 and the processing volume 129 of the processing chamber 100. For example, the RF match 172 is an electrical circuit used between the RF generator 171 and a plasma reactor (e.g., the processing volume 129 of the processing chamber 100) to optimize power delivery efficiency. One or more RF filters (e.g., within the RF match 172) are designed to only allow powers in a selected frequency range, and to isolate RF power supplies from each other. In some cases, a bandwidth of an RF filter has to be larger than a frequency tuning range of the RF generator 171.

During the plasma processing, the RF generator 171 delivers an RF signal to the substrate support assembly 136 via the RF match 172. For example, the RF signal is applied to a load (e.g., gas) in the processing volume 129 of the processing chamber 100. If an impedance of the load is not properly matched to an impedance of a source (e.g., the RF generator 171), a portion of a waveform can reflect back in an opposite direction. Accordingly, to prevent a substantial portion of the waveform from reflecting back, some implementations find a match impedance (e.g., a matching point) by adjusting one or more components of the RF match 172 as the source and load impedances change.

The RF match 172 is electrically coupled to the RF generator 171, the substrate support assembly 136, and the PV waveform generator 175. The RF match 172 is configured to receive a synchronization signal from either or both of the RF generator 171 and the PV waveform generator 175.

The RF generator 171 and the PV waveform generator 175 are each directly coupled to a system controller 126. The system controller 126 synchronizes the respective generated RF signal and PV waveform.

Voltage and current sensors can be placed at an input and/or output of the RF match 172 to measure impedance and other parameters. These sensors can be synchronized using an external transistor-transistor logic (TTL) synchronization signal from an advanced waveform generator and/or RF generators or using measured voltage and current data to determine timing internally. For example, an output sensor 117 is configured to measure the impedance of the plasma processing chamber 100, and other characteristics such as the voltage, current, harmonics, phase, and/or the like. An input sensor 116 is configured to measure the impedance of the RF generator 171 and other characteristics such as the voltage, current, harmonics, phase, and/or the like. Based on either of the synchronization signals or the characteristics of the plasma processing chamber 100, the RF match 172 is able to capture fast impedance changes and optimize impedance matching.

The PV waveform generator 175 is used to supply a PV waveform and/or a tailored voltage waveform, which is a sum of harmonic frequencies associated with the waveform. The PV waveform generator 175 may output a synchronization TTL signal to the RF match 172. The voltage waveform is coupled to a bias electrode (e.g., a bias electrode 104 shown in FIG. 1B) through the filter assembly 178. The high DC voltage supply 173 is applied to chuck a substrate during a process for a thermal control. In some cases, there can be a third electrode at an edge of the cathode assembly for edge uniformity control.

Figure 1B:
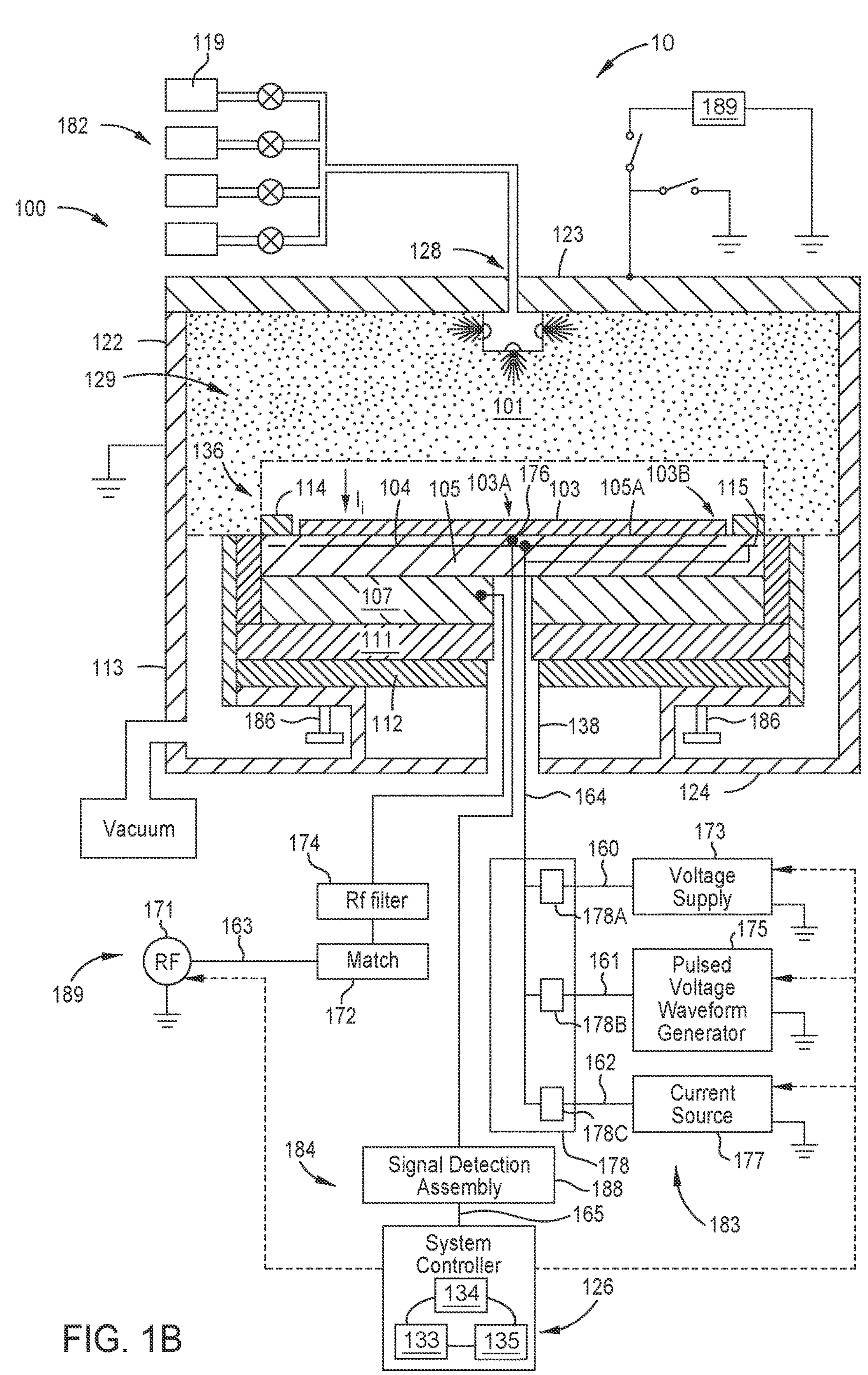
FIG. 1B is a schematic detailed cross-sectional view of the plasma processing system, in accordance with certain embodiments of the present disclosure.

FIG. 1B is a schematic detailed cross-sectional view of the plasma processing system 10. As shown in FIG. 1B, the plasma processing system 10 is configured to form a capacitively coupled plasma (CCP). However, in some embodiments, the plasma 101 may alternately be generated by an inductively coupled source disposed over the processing region of the plasma processing system 10. In this configuration, a coil may be placed on top of a ceramic lid (e.g., vacuum boundary) of the plasma processing chamber 100.

The plasma processing system 10 includes the processing chamber 100, the substrate support assembly 136, the gas delivery system 182, a DC power system 183, an RF power system 189, and the system controller 126. The processing chamber 100 includes a chamber body 113 that includes the chamber lid 123, one or more sidewalls 122, and a chamber base 124. The chamber lid 123, the one or more sidewalls 122, and the chamber base 124 collectively define the processing volume 129 of the processing chamber 100. The one or more sidewalls 122 and the chamber base 124 include materials (such as aluminum, aluminum alloys, or stainless steel alloys) that are sized and shaped to form a structural support for elements of the processing chamber 100 and are configured to withstand the pressures and added energy applied to them while the plasma 101 is generated within a vacuum environment maintained in the processing volume 129 of the processing chamber 100 during processing. A substrate 103 is loaded into, and removed from, the processing volume 129 of the processing chamber 100 through an opening (not shown) in one of the sidewalls 122. The opening is sealed with a slit valve (not shown) during plasma processing of the substrate 103.

The gas delivery system 182, which is coupled to the processing volume 129 of the processing chamber 100, includes the processing gas source 119 and the gas inlet 128 disposed through the chamber lid 123. The gas inlet 128 is configured to deliver one or more processing gases to the processing volume 129 of the processing chamber 100 from the processing gas source 119.

As noted above, the processing chamber 100 includes the upper electrode (e.g., the chamber lid 123) and the lower electrode (e.g., the substrate support assembly 136) disposed in the processing volume 129 of the processing chamber 100. The upper electrode and lower electrode are positioned to face each other. As seen in FIG. 1B, the RF generator 171 is electrically coupled to the lower electrode. The RF generator 171 is configured to deliver an RF signal to ignite and maintain the plasma 101 between the upper and lower electrodes. In some alternative configurations, the RF generator 171 can also be electrically coupled to the upper electrode.

The substrate support assembly 136 includes a substrate support 105, a substrate support base 107, an insulator plate 111, a ground plate 112, a plurality of lift pins 186, one or more substrate potential sensing assemblies 184 (e.g., including a signal detecting assembly 188), and a bias electrode 104. Each of the lift pins 186 are disposed through a through hole 185 formed in the substrate support assembly 136 and are used to facilitate the transfer of the substrate 103 to and from a substrate receiving surface 105A of the substrate support 105. The substrate support 105 is formed of a dielectric material. The dielectric material can include a bulk sintered ceramic material, a corrosion-resistant metal oxide (for example, aluminum oxide ($Al_2O_3$), titanium oxide (TiO), yttrium oxide ($Y_2O_3$), a metal nitride material (for example, aluminum nitride (AlN), titanium nitride (TiN)), mixtures thereof, or combinations thereof.

The substrate support base 107 is formed of a conductive material (for example aluminum, an aluminum alloy, or a stainless steel alloy). The substrate support base 107 is electrically isolated from the chamber base 124 by the insulator plate 111, and the ground plate 112 interposed between the insulator plate 111 and the chamber base 124. The substrate support base 107 is configured to regulate the temperature of both the substrate support 105, and the substrate 103 disposed on the substrate support 105 during substrate processing. The substrate support base 107 includes one or more cooling channels (not shown) disposed therein that are fluidly coupled to, and in fluid communication with, a coolant source (not shown), such as a refrigerant source or substrate source having a relatively high electrical resistance. The substrate support 105 includes a heater (not shown) to heat the substrate support 105 and the substrate 103 disposed on the substrate support 105.

The bias electrode 104 is embedded in a dielectric material of the substrate support 105. The bias electrode 104 is formed of one or more electrically conductive parts. The electrically conductive parts include meshes, foils, plates, or combinations thereof. The bias electrode 104 functions as a chucking pole (i.e., electrostatic chucking electrode) that is used to secure (e.g., electrostatically chuck) the substrate 103 to the substrate receiving surface 105A of the substrate support 105. A parallel plate like structure is formed by the bias electrode 104 and a layer of the dielectric material that is disposed between the bias electrode 104 and the substrate receiving surface 105A. The dielectric material can have an effective capacitance CE of between about 5 nF and about 50 nF. A layer of the dielectric material (e.g., aluminum nitride (AlN), aluminum oxide ($Al_2O_3$), etc.) has a thickness between about 0.3 mm and about 5 mm, such as between about 0.1 mm and about 3 mm, such as between about 0.1 mm and about 1 mm, or even between about 0.1 mm and 0.5 mm. The bias electrode 104 is electrically coupled to a clamping network, which provides a chucking voltage thereto. The clamping network includes the DC voltage supply 173 (e.g., a high voltage DC supply) that is coupled to a filter 178A of the filter assembly 178 that is disposed between the DC voltage supply 173 and the bias electrode 104. The filter 178A is a low-pass filter that is configured to block RF frequency and PV waveform signals provided by other biasing components found within the processing chamber 100 from reaching the DC voltage supply 173 during the plasma processing. The static DV voltage is between about −5000V and about 5000V, and is delivered using an electrical conductor (such as a coaxial power delivery line 106). The bias electrode 104 may bias the substrate 103 with the respect to the plasma 101 using one or more of the PV biasing schemes.

The substrate support assembly 136 includes an edge control electrode 115. The edge control electrode 115 is formed of one or more electrically conductive parts. The electrically conductive parts include meshes, foils, plates, or combinations thereof. The edge control electrode 115 is positioned below an edge ring 114 and surrounds the bias electrode 104 and/or is disposed a distance from a center of the bias electrode 104. For the processing chamber 100 that is configured to process circular substrates, the edge control electrode 115 is annular in shape, is made from a conductive material, and is configured to surround at least a portion of the bias electrode 104. As seen in FIG. 1B, the edge control electrode 115 is positioned within a region of the substrate support 105, and is biased by use of the PV waveform generator 175. The edge control electrode 115 is biased by use of a PV waveform generator that is different from the PV waveform generator 175 used for the bias electrode 104. The edge control electrode 115 is biased by splitting part of a signal provided from the PV waveform generator 175 to the bias electrode 104.

The DC power system 183 includes the DC voltage supply 173, the PV waveform generator 175, and a current source 177. The RF power system 189 includes the RF waveform generator 171, the RF matching circuit 172, and an RF filter 174. As shown in FIG. 1B, a power delivery line 163 electrically connects an output of the RF generator 171 to the RF matching circuit 172, the RF filter 174 and the substrate support base 107. As noted above, during the plasma processing, the DC voltage supply 173 provides a constant chucking voltage, while the RF generator 171 delivers the RF signal to the processing region, and the PV waveform generator 175 establishes the PV waveform at the bias electrode 104. For example, a sufficient amount of the RF power is applied to an RF bias voltage signal (which is also referred to herein as the RF waveform), and the RF waveform is provided to an electrode (e.g., the substrate support base 107) to cause the plasma 101 to be formed in the processing volume 129 of the processing chamber 100. The RF waveform has a frequency range between about 1 MHz and about 200 MHz, such as between 2 MHz and 40 MHz.

The DC power system 183 includes the filter assembly 178 to electrically isolate one or more of the components contained within the DC power system 183. A power delivery line 160 electrically connects an output of the DC voltage supply 173 to the filter assembly 178. A power delivery line 161 electrically connects the output of the PV waveform generator 175 to the filter assembly 178. A power delivery line 162 connects the output of the current source 177 to the filter assembly 178.

The current source 177 is selectively coupled to the bias electrode 104 by use of a switch (not shown) disposed in the power delivery line 162, to allow the current source 177 to deliver a desired current to the bias electrode 104 during one or more stages (e.g., ion current stage) of the voltage waveform generated by the PV waveform generator 175.

The filter assembly 178 includes multiple separate filtering components (i.e., discrete filters 178A-178C) that are each electrically coupled to an output node via a power delivery line 164. The filter assembly 178 may include one common filter electrically coupled to the output node via the power delivery line 164. The power delivery lines 160-164 include electrical conductors that include a combination of coaxial cables, such as a flexible coaxial cable that is connected in series with a rigid coaxial cable, an insulated high-voltage corona-resistant hookup wire, a bare wire, a metal rod, an electrical connector, of any combination of the above.

The system controller 126, also referred to herein as a processing chamber controller, includes a central processing unit (CPU) 133, a memory 134, and support circuits 135. The system controller 126 is used to control a process sequence used to process the substrate 103. The CPU is a computer processor configured for use in an industrial setting for controlling the processing chamber and sub-processors related thereto. The memory 134 described herein, which is generally non-volatile memory, can include random access memory, read-inly memory, hard disk drive, or other suitable forms of digital storage, local or remote. The support circuits 135 are coupled to the CPU 133 and include cache, clock circuits, input/output subsystems, power supplied, and the like, and combinations thereof. Software instructions (program) and data can be coded and stored within the memory 134 for instructing a processor within the CPU 133. A software program (or computer instructions) readable by the CPU 133 in the system controller 126 determines which tasks are performable by the components in the plasma processing system 10.

The program, which is readable by the CPU 133 in the system controller 126 includes code, which, when executed by the CPU 133, performs tasks relating to the plasma processing schemes described herein. The program may include instructions that are used to control the various hardware and electrical components within the plasma processing system 10 to perform the various process tasks and various process sequences used to implement the methods described herein. The program includes instructions that are used to perform one or more of the operations described herein.

Figure 2:
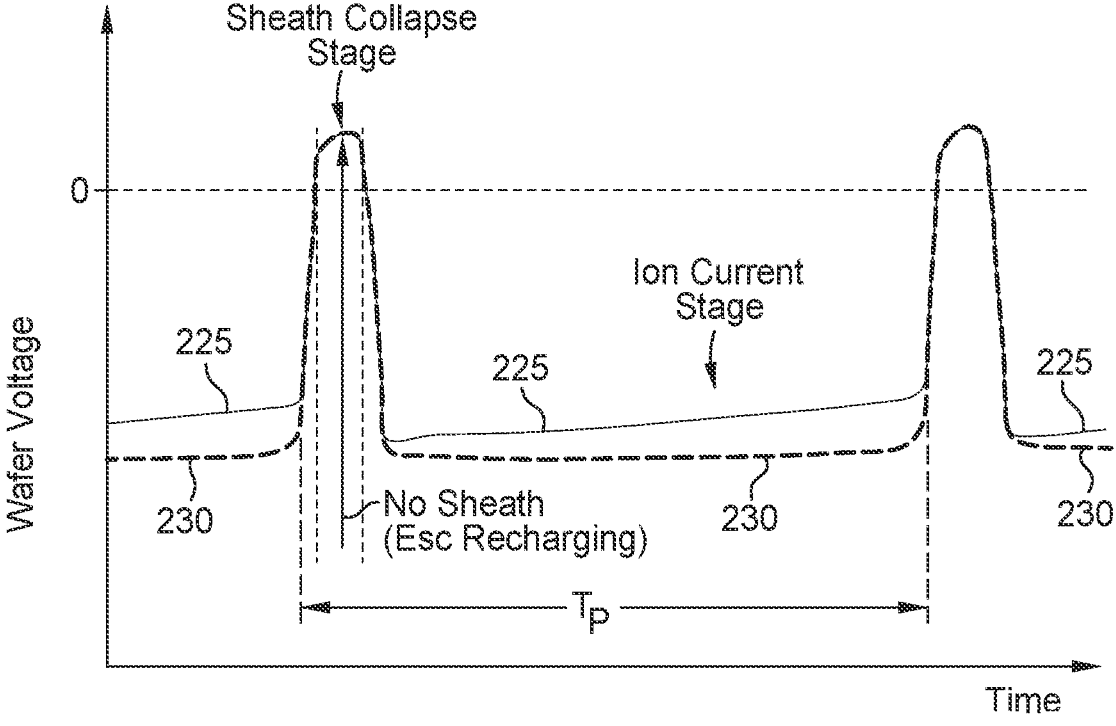
FIG. 2 shows a voltage waveform that is established on a substrate due to a voltage waveform applied to an electrode of a processing chamber, in accordance with certain embodiments of the present disclosure.

FIG. 2 illustrates two separate voltage waveforms established at the substrate 103 disposed on the substrate receiving surface 105A of the substrate support assembly 136 of the processing chamber 100 due to the delivery of PV waveforms to the bias electrode 104 of the processing chamber 100. A first waveform (e.g., a waveform 225) is an example of a non-compensated PV waveform established at the substrate 103 during the plasma processing. A second waveform (e.g., a waveform 230) is an example of a compensated PV waveform established at the substrate 103 by applying a negative slope waveform to the bias electrode 104 of the processing chamber 100 during an "ion current stage" portion of the PV waveform cycle by use of the current source 177. The compensated PV waveform can alternatively be established by applying a negative voltage ramp during the ion current stage of the PV waveform generated by the PV waveform generator 175. The PV waveform cycle of the waveforms 225, 230 each have a period $T_p$, which is, for example, typically between 2 microsecond (μs) and 10 μs, such as 2.5 μs. The ion current stage of the PV waveform cycle will typically take up between about 50% and about 95% of the period $T_p$, such as from about 80% to about 90% of the period $T_p$.

The waveforms 225 and 230 include two main stages: an ion current stage and a sheath collapse stage. Both portions (e.g., the ion current stage and the sheath collapse stage) of the waveforms 225 and 230, can be alternately and/or separately established at the substrate 103 during the plasma processing. At a beginning of the ion current stage, a drop in the voltage at the substrate 103 is created, due to the delivery of a negative portion of the PV waveform (e.g., the ion current portion) provided to the bias electrode 104 by the PV waveform generator 175, which creates a high voltage sheath above the substrate 103. The high voltage sheath allows the plasma generated positive ions to be accelerated towards the biased substrate 103 during the ion current stage, and thus, for RIE processes, controls the amount and characteristics of the etching process that occurs on the surface of the substrate 103 during the plasma processing. In some embodiments, it is desirable for the ion current stage to include a region of the PV waveform that achieves the voltage at the substrate 103 that is stable or minimally varying throughout the stage, as illustrated in FIG. 2 by the waveform 230. One will note that significant variations in the voltage established at the substrate 103 during the ion current stage, such as shown by the positive slope in the waveform 225, will undesirably cause a variation in the ion energy distribution (IED) and thus cause undesirable characteristics of the etched features to be formed in the substrate 103 during the RIE process.

Plasma sheath impedance varies with supplied PV waveform voltages. The RF match 172 can use either or both of the synchronization signals and/or use its internal sensors to sample impedances in different processing phases. In one example, a synchronization signal or characteristics determined by the input sensor 116 or the output sensor 117 are used to trigger the RF match 172 to determine at least two different impendences at different processing stages. Then, the RF match 172 updates its matching point based on the at least two different impedances.

Figure 3:
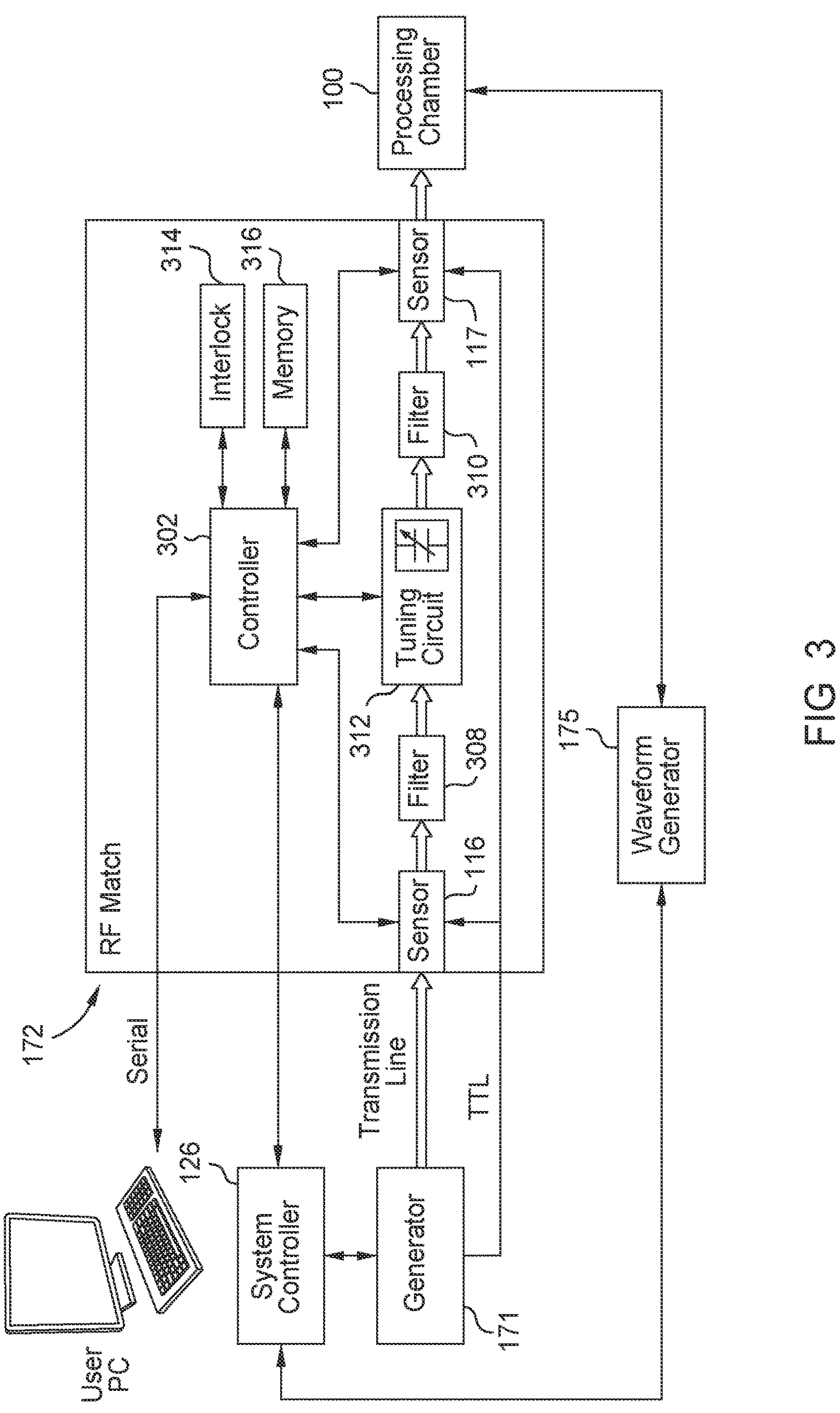
FIG. 3 is a schematic representation of a radio frequency (RF) matching network, in accordance with certain embodiments of the present disclosure.

FIG. 3 is a schematic representation of an RF match 172. The RF match 172 includes a controller 302, the input sensor 116, the output sensor 117, a first RF filter 308, a second RF filter 310, a tuning circuit 312, an interlock 314, and a memory 316. The two RF filter circuits (e.g., the first RF filter 308 and the second RF filter 310) are near both an input and an output of the RF match 172. In some cases, only one RF filter may be used near the output of the RF match 172.

The RF match 172 is connected to the RF generator 171 through a 50Ω transmission line. The RF generator 171 may supply power at frequencies between 100 kHz and 200 MHz. The RF generator 171 has a frequency tuning capability and can adjust its RF power frequency within e.g. ±5% or ±10%. The RF generator 171 sends a TTL signal to the input sensor 116 and the output sensor 117 directly for fast response and better synchronization. The RF match 172 may be configured to receive the RF waveform from the RF generator 171, tune the RF waveform to minimize the reflected power and maximize power delivery efficiency, and deliver the tuned RF waveform to the plasma chamber 100, in some implementations. Simultaneously, as noted above, the PV waveform generator 175 is configured to provide the PV waveform to the processing chamber 100. The RF generator 171 and the PV waveform generator 175 are both coupled to and synchronized by the controller 302.

The controller 302 may work with various communication protocols, e.g., RS-232, RS-485, USB, Ethernet, or Ethernet for Control Automation Technology (ECAT). The controller 302 may serve as a local EtherCAT master. Other components (e.g., the input sensor 116, the output sensor 117, motors) are EtherCAT slave devices, which are controlled by the controller 302.

The controller 302 may be coupled to the interlock 314, the memory 316, the tuning circuit 312, the input sensor 116, the output sensor 117, and the system controller 126. The controller 302 includes a CPU. The controller 302 is configured to control the tuning circuit 312 to change an impedance parameter of the RF match 172. In one example, the tuning circuit 312 is a T-network tuning circuit. In another example, the tuning circuit 312 is a pi-network tuning circuit. In another example, the tuning circuit 312 is an L-network tuning circuit. The tuning circuit 312 may include one or more capacitors and inductors that can be adjusted by the controller 302 to change the impedance of the RF waveform delivered to the processing chamber 100.

The system controller 126 can communicate with the RF match 172, the RF generator 171 and/or other chamber components. The controller 302 can communicate with the system controller 126 using EtherCAT. The controller 302 can do a master to slave conversion, which allows communication to the system controller 126 EtherCAT master. The controller 302 receives requests from the system controller 126, and provides feedback. Also, the system controller 126 receives forward and reflected power information from the RF generator 171 and gets data from all internal devices of the RF match 172. The RF generator 171 can also be controlled by the system controller 126 for a cooperative intelligent real time control and tuning.

The memory 316 may be programmed for long term or short term memory storage. The memory 316 described herein, which is generally non-volatile memory, can include random access memory, read-only memory, hard disk drive, or other suitable forms of digital storage, local or remote. Software instructions (program) and data can be coded and stored within the memory 316 for instructing a processor within the controller 302. A software program (or computer instructions) readable by controller 302 determines which tasks are performable by the components in the plasma processing system 10. The program, which is readable by the controller 302 includes code, which, when executed, performs tasks relating to the plasma processing schemes described herein. The program may include instructions that are used to control the RF match 172 using the methods described herein. The program includes instructions that are used to perform one or more of the operations described herein.

The interlock 314 is implemented for safety purposes to control over temperature switches, cable-in-place switches, and match-in-place switches, etc. The interlock 314 is open when failure happens, and an interlock signal will be sent from a local microcontroller to both a user laptop and the system controller 126 to shut the system off.

The RF match 172 may include a serial control port for algorithm uploading, and an external match control (e.g., by using an external software and application programming interface (API)). Automatic impedance tuning algorithms and preset variable capacitor positions are stored on the memory 316. Sensor data and tuning algorithms can be accessed from an external user laptop, which provides great flexibility to the RF match 172. Furthermore, advanced process related control algorithm can be deployed in real time. The RF match 172 can operate fully autonomously, cooperatively with the system controller 126 or manually controlled by the external user laptop.

The output sensor 117 may include a voltage sensor and/or a current sensor configured to measure the impedances or the characteristics of the plasma processing system 10 explained above. The input sensor 116 may include a voltage sensor and/or a current sensor configured to measure characteristics of the RF waveform such as voltage, current, phase, or harmonics. In some cases, only one sensor can be used at the input of the RF match 172. Sensor readings can be used in a feedback and feedforward algorithms for impedance matching.

The output sensor 117 is configured to sample a first set of impedances of the plasma processing system 10 over a first period of time and report them to the controller 302. The output sensor 117 is also configured to sample a second set of impedances of the plasma processing system 10 over a second period of time and report them to the controller 302. The first period of time may begin after a first delay that is triggered (i.e. measured) after a first portion of a waveform pulse of a synchronization signal or internally by the sensors detecting a change in a characteristic of the PV waveform or the RF waveform. The second period of time may begin after a second delay that is triggered at the same time as the first delay. The second delay is longer than the first delay.

The controller 302 uses the both sets of impedances to determine a first impedance and a second impedance and combine them into a combined impedance. Then, based on the combined impedance parameter, the controller 302 adjusts the one or more capacitor(s) of the tuning circuit 312 to change the matching point of the RF match 172 so that the impedance of the generated RF waveform matches the impedance of the plasma processing system 10. Then, after adjusting the tuning circuit 312 based on the combined impedance parameter, the controller 302 may further fine tune the tuning circuit 312 based on the impedance of the RF waveform sampled by the input sensor 116.

Example Techniques for Substrate Processing and Tuning

As described with respect to FIG. 3, some implementations use an RF match to reduce (e.g., minimize) reflected power at a designed frequency. The input and output sensors (e.g., if available), such as sensors 116, 117, may be calibrated to measure voltage and current waveforms at a designed frequency (e.g., fundamental frequencies) and may operate to reduce reflected power. Certain embodiments of the present disclosure are directed towards processing system with one or more sensors measuring not only fundamental frequencies but also harmonics and the intermodulation products to be used tune and improve various processing metrics.

While reducing reflected power for the RF generator may be considered, some embodiments of the present disclosure consider other criteria for tuning during substrate processing. For example, certain embodiments provide a tuning algorithms that may be developed using a combination of at least two of fundamental, harmonic, and intermodulation frequencies for improved substrate results and more precise process control. As used herein, substrate results (also referred to as a "wafer processing metric") may refer to one or more quality parameters associated with processing a substrate, such as a level of process variation, etch rate, and/or uniformity.

In some embodiments, RF match tuning in the frequency domain may be performed using voltage, current, phase, of selected harmonics and/or the intermodulation components. The RF match may tune to configurations with certain frequency domain fingerprint patterns which are related to less process variation, faster etch rate and/or better uniformity. In some embodiments of the present disclosure, a waveform may be reconstructed from harmonic components, and reported to a controller for real time plotting and to be used for tuning, as described in more detail herein.

Figure 4:
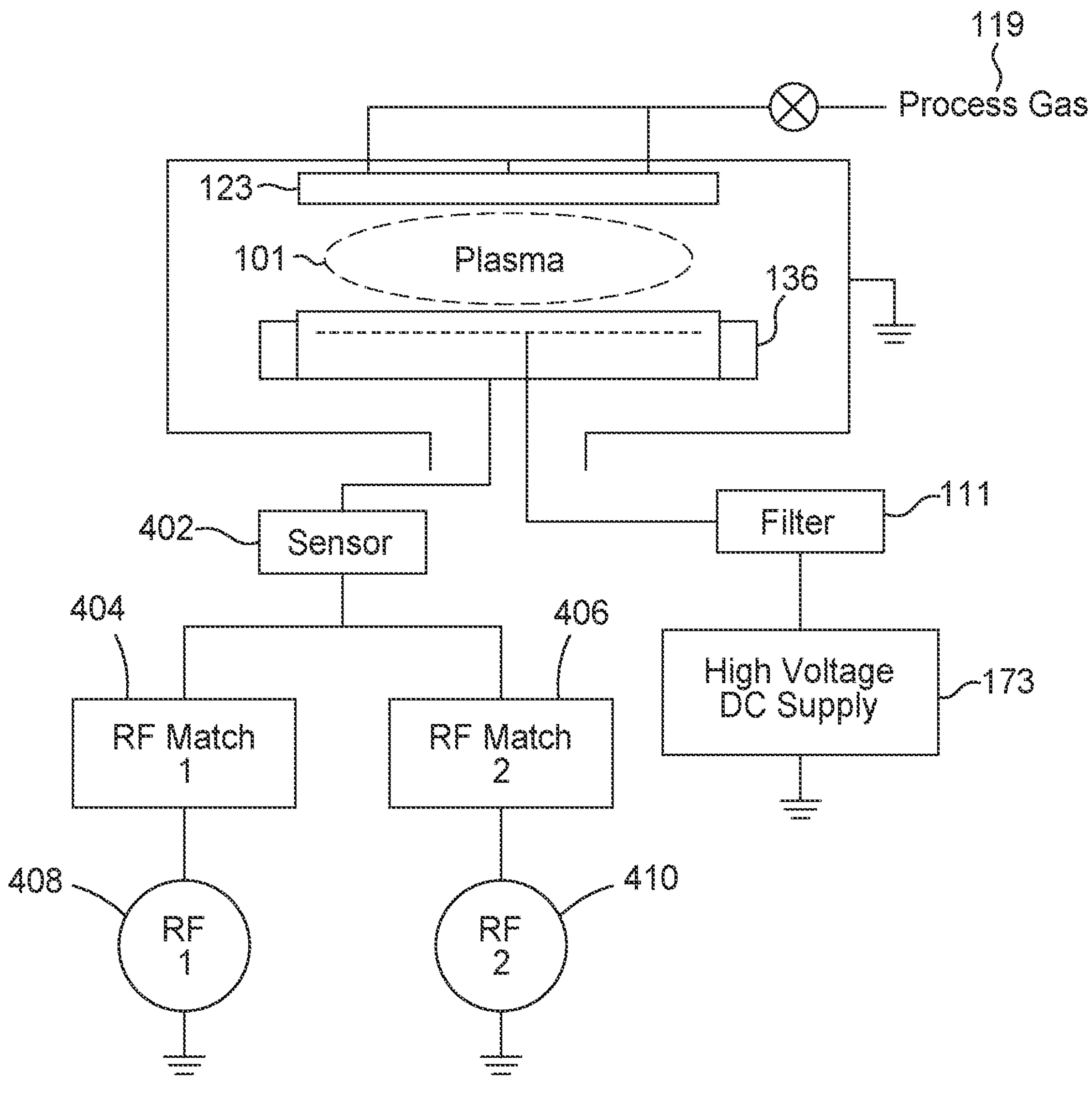
FIG. 4 is a schematic representation of a plasma processing system with RF generators and respective RF match circuits, in accordance with certain embodiments of the present disclosure.

FIG. 4 is a schematic representation of a plasma processing system with two RF generators 408, 410 (labeled "RF1" and "RF2") and respective RF match 404 (labeled "RF match 1") and RF match 406 (labeled "RF match 2"). Each of the RF generators 408, 410 may be implemented in a similar manner as RF generator 171 described with respect to FIG. 1. Each of the RF match 404 and RF match 406 may be implemented in a similar manner as RF match 172 described herein. As shown, a sensor 402 may be coupled to outputs RF match 404 and RF match 406 in FIG. 4. Thus, sensor 402 may be used to measure intermodulation and harmonic components of the combined output of the RF match 404 and RF match 406.

The RF generators 408, 410 may generate two or more frequencies which may be synchronized with phase control. In some cases, the RF generators may be operated in-phase or out-of-phase, depending on calibration to meet certain processing metrics. In some embodiments, another RF signal may be applied from the top electrode (e.g., the chamber lid 123) in capacitively coupled plasma reactors or a top coil in inductively coupled plasma reactors. As shown, the sensor 402 may be at the RF match output for measuring a series of selected harmonic and intermodulation components. In some embodiments the sensor may be coupled to an RF rod that is used to couple the RF generators 408, 410 to an electrode (e.g., bias electrode 104 in FIG. 1B) disposed with the substrate support assembly 136 within the processing region of the processing chamber.

Figure 5:
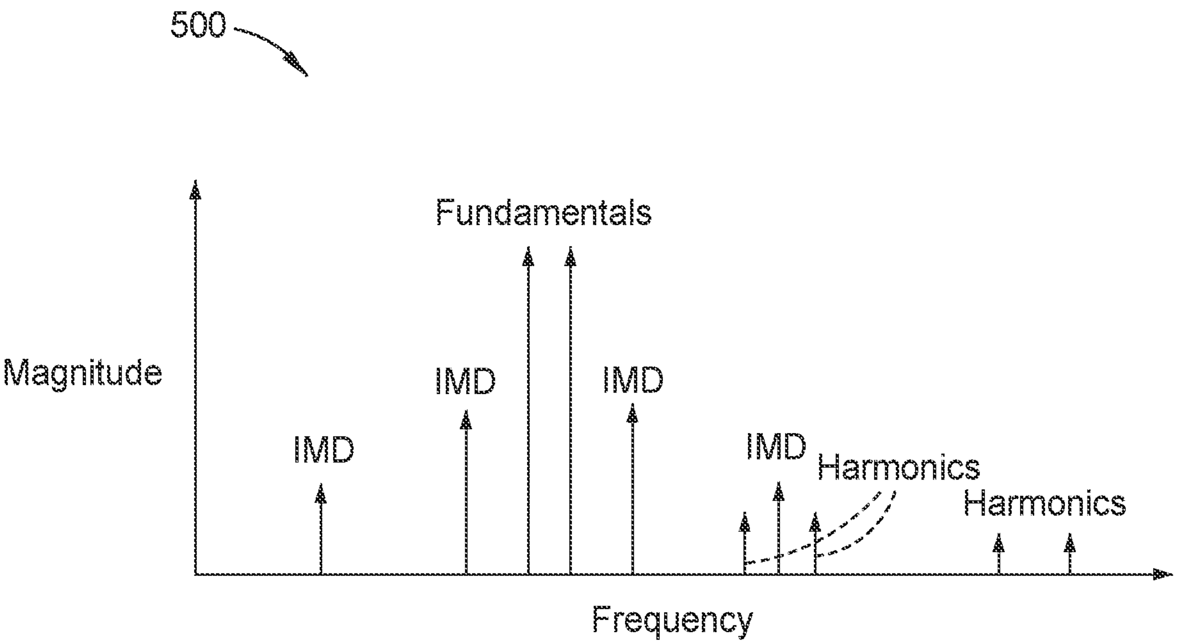
FIG. 5 is a graph illustrating fundamental, intermodulation, and harmonic components of a signal in the frequency domain.

FIG. 5 is a graph 500 illustrating fundamental, intermodulation, and harmonic components of a signal in the frequency domain. In some embodiments, during a calibration phase, signals having different harmonic and intermodulation components may be used to process various test substrates to identify components providing the best substrate processing results or metrics (e.g., or at least wafer processing metrics that meets certain thresholds). For example, a certain ratio of at least two intermodulation or harmonic components may be identified as providing the best substrate processing metrics. When processing a substrate, a sensor (e.g., sensor 402) may be used to measure the intermodulation and harmonic components, and adjust a configuration of the match 172 (and/or other processing devices such as the PV waveform generator 175 or RF generator 171 of FIG. 1B) in accordance with the ratio identified during calibration. In some cases, the one or more sensors in the RF match 172 (e.g., sensor 117 of FIG. 3) may be used to measure the intermodulation and harmonic component(s), or one or more sensors (e.g., sensor 402) external to the RF match 172 may alternately or additionally be used.

Figure 6:
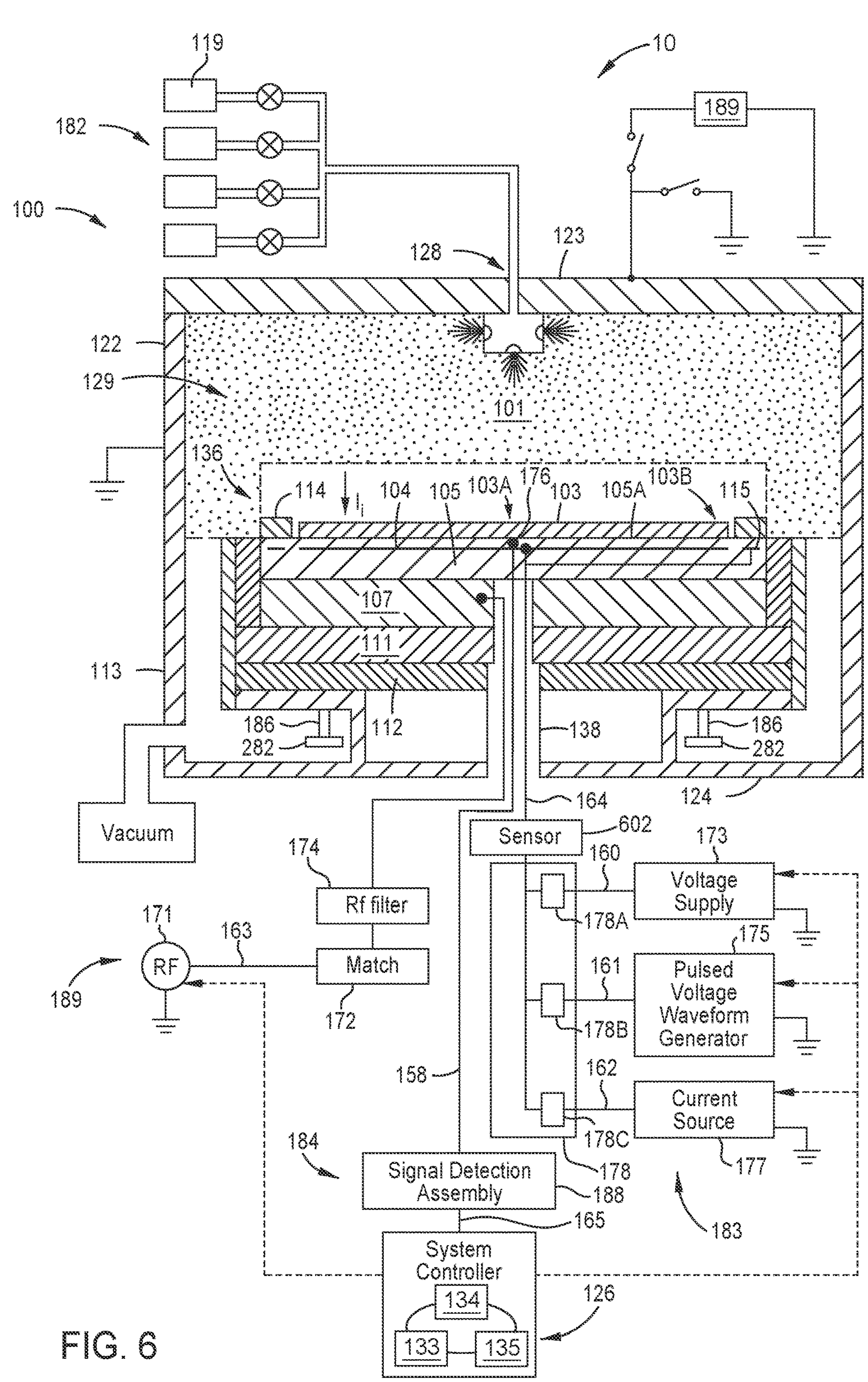
FIG. 6 is a schematic representation of a plasma processing system having a sensor coupled to an output of a pulsed voltage (PV) waveform generator, in accordance with certain embodiments of the present disclosure.

FIG. 6 is a schematic representation of a plasma processing system having a sensor 602 coupled to an output of a PV waveform generator 175, in accordance with certain embodiments of the present disclosure. The sensor 602 may be coupled to the power delivery line 164. The sensor 602 may measure intermodulation and harmonic components at the power delivery line 164, based on which PV waveform generator 175 and/or RF generator 171 is being controlled. For example, based on the measured harmonic and/or intermodulation components, a PV waveform (e.g., waveform 230 described with respect to FIG. 2) may be reconstructed to yield a reconstructed waveform. In some cases, the reconstructed waveform may be stored in memory. The reconstructed waveform may be reported to a controller for real time plotting and to control of the PV waveform generator 175 and/or RF generator 171. For instance, the PV waveform generator 175 may generate a PV waveform, which may be rectangular wave with certain on and off times (e.g., where the on time corresponds to the ion current stage shown in FIG. 2 and the off time corresponds to the sheath collapse stage shown in FIG. 2) and/or voltage pulse characteristics, such as voltage waveform shape (e.g., dV/dt). However, the signal at the power delivery line 164, and/or at the substrate, may have different on and off times (e.g., due to parasitics and capacitive coupling) than the rectangular wave generated by the PV waveform generator 175. Based on the reconstructed waveform, the output of the PV waveform generator 175 may be controlled to adjust the on and off times or shape of the PV waveform generated by the PV waveform generator 175 to improve metrics and substrate processing results seen on a substrate.

As described with respect to FIG. 3, the RF match sensor (e.g., sensor 116) at the input of the RF match 172 may measure the fundamental frequency of the RF generator 171, which may be used to tune (e.g., reduce or minimize) the reflected power at the input of the RF match 172. In some embodiments of the present disclosure, the output sensor (e.g., sensor 117) may measure fundamentals, selected harmonics and intermodulation components and uses two or more of the measured components for match tuning (e.g., RF match tuning in the frequency domain). The adjusted match tuning values may be different from the original match tuning values used to reduce the reflected power provided at the fundamental frequency. For instance, as described herein, a ratio of at least two selected harmonics or intermodulation components may be identified during calibration to provide the best metrics, as described herein. The match tuning (e.g., capacitances of the tuning circuit 312) may be adjusted based on the identified ratio (e.g., so that the measured ratio is about equal to the identified ratio during calibration). While the sensor used to measure the intermodulation and/or harmonic components may be in the RF match 172, the sensor may be anywhere on the transmission line. The measured frequency domain plot may be used for advanced process control, plasma property analysis, etch rate and uniformity improvement.

In some embodiments, the magnitude and/or phase of one or more selected frequencies and/or intermodulation/harmonic components may be used for RF match tuning. The capacitance of one or more capacitive elements of the RF match 172 may be adjusted based on the selected frequency components and/or the ratio between frequency components. Thus, the RF match may be used to tune to identified frequency component values based on a specific frequency domain fingerprint pattern which is related to less process variation, improved plasma processing and/or etch process results, faster etch rate and/or better uniformity. Typically, the identified frequency component values are different from the fundamental frequency provided by the one or more RF sources.

Figure 7:
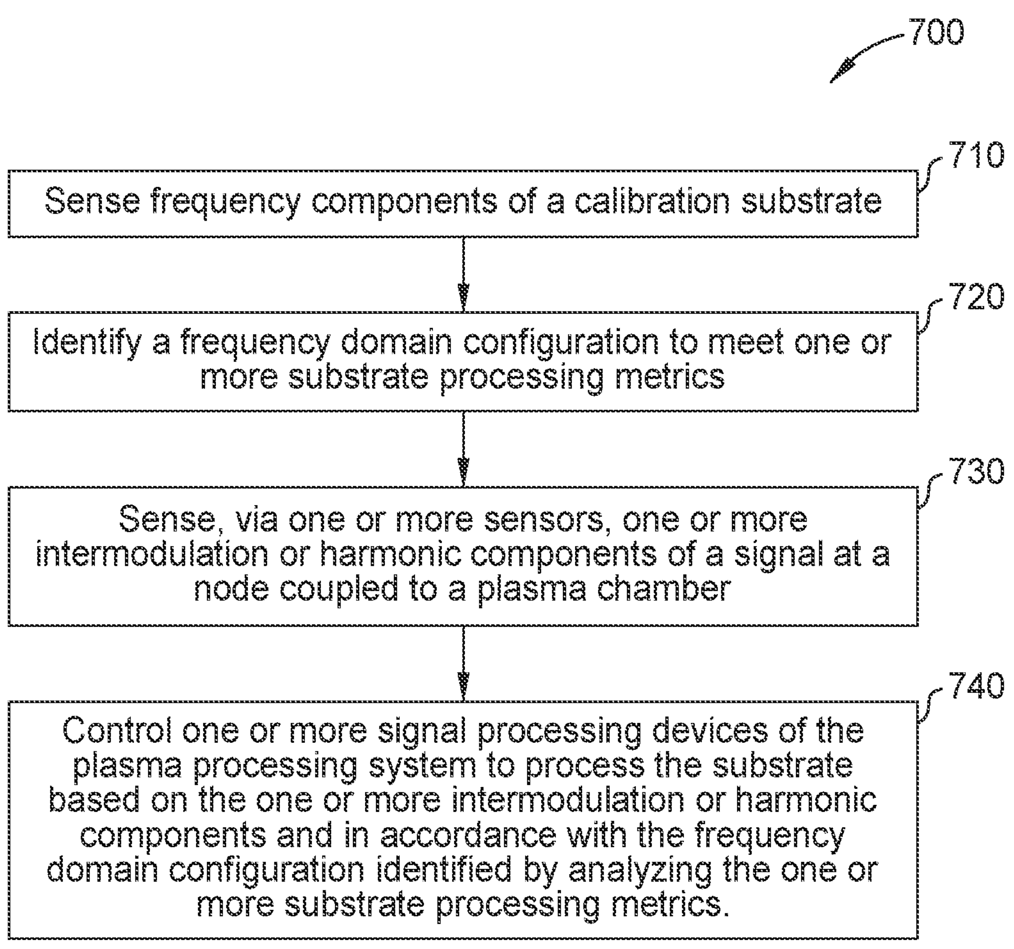
FIG. 7 is a process flow diagram illustrating a method for processing a substrate in a plasma processing system, in accordance with certain embodiments of the present disclosure.

FIG. 7 is a process flow diagram illustrating a method 700 for processing a substrate in a plasma processing system, in accordance with certain embodiments of the present disclosure. The method 700 can be performed by a plasma processing system, such as the plasma processing system described with respect to FIGS. 3, 4, and 6.

At operation 710, the plasma processing system senses generated frequency components during the performance of plasma processing recipe performed on a calibration substrate. The plasma processing system senses (e.g., via one or more sensors) one or more intermodulation or harmonic components of a signal at a node coupled to a plasma chamber.

At operation 720, the plasma processing system identifies a frequency domain configuration used to meet one or more substrate processing metrics. For example, plasma processing attributes achieved on a processed calibration substrate may be measured at operations 710 and the collected frequency domain data and process recipe data may be used to control subsequent substrate processes and/or stored in memory. The attributes, for example, can include the one or more substrate processing metrics, such as etch rate, etch profile distortion, or etch rate uniformity associated with the calibration substrate. During operation 720, the process results and process data collected may be correlated to one or more intermodulation or harmonic component data, which includes one or more measured points within the frequency domain measured during the performance of the operation 710, so that variations in the process results, or process metrics, are correlated to the one or more intermodulation or harmonic component data measured during the performance of the operation 710.

At operation 730, the plasma processing system senses (e.g., via one or more sensors) one or more intermodulation or harmonic components of a signal at the node coupled to a plasma chamber. For example, the one or more signal processing devices may include a match circuit (e.g. match 172 of FIG. 3, or match 404 of FIG. 4), and the node coupled to the plasma chamber may be an output of the match circuit. The node coupled to the plasma chamber may be external to the match circuit, in some implementations.

At operations 740, the plasma processing system uses the correlation data collected during, or as a result of, the performance of operations 710 and 720 to control one or more signal processing devices of the plasma processing system to adjust the RF match tuning parameters and/or PVT waveform characteristics used to process the substrate based on the one or more intermodulation or harmonic components determined to achieve improved substrate process results. The RF match tuning parameters are adjusted in accordance with a frequency domain configuration identified during operation 720 by analyzing one or more substrate processing metrics collected on a calibration substrate. The frequency domain configuration may be a ratio between magnitudes of at least two intermodulation or harmonic components. The one or more processing metrics may include process variation, etch rate, or uniformity associated with substrate processing.

In some embodiments, the plasma processing system may construct a PV waveform based on the sensed one or more intermodulation or harmonic components. The one or more signal processing devices may be controlled based on the constructed PV waveform. The one or more signal processing devices may include at least one of a PV waveform generator (e.g., PV waveform generator 175) or a RF generator (e.g., RF generator 171), which may be controlled based on the constructed PV waveform.

In some embodiments, controlling the one or more signal processing devices may include controlling at least one of a magnitude or phase of one or more output signals of the one or more signal processing devices. The one or more signal processing devices may include a first match circuit (e.g., match 404 of FIG. 4) and a second match circuit (e.g., match 406 of FIG. 4). The one or more sensors may include a sensor (e.g., sensor 402 of FIG. 4) coupled to the outputs of the first match circuit and the second match circuit. In some aspects, the sensor output signal from sensor 402 may be fed back to at least one of the RF generator 408 or RF generator 410 and used to adjust the output power level, output frequency, and/or phase difference of RF signals.

While the foregoing is directed to embodiments of the present disclosure, other and further embodiments of the disclosure may be devised without departing from the basic scope thereof, and the scope thereof is determined by the claims that follow.

What is claimed is:

1. A method for processing a substrate in a plasma processing system, comprising:

sensing, via one or more sensors, one or more intermodulation or harmonic components of a signal at a node coupled to a plasma chamber; and controlling one or more signal processing devices of the plasma processing system to process the substrate based on the one or more intermodulation or harmonic components and in accordance with a frequency domain configuration identified by analyzing one or more substrate processing metrics, wherein the one or more signal processing devices comprises a first match circuit, and wherein controlling the one or more signal processing devices comprises controlling one or more impedances of the first match circuit based on the one or more intermodulation or harmonic components and in accordance with the frequency domain configuration.

2. The method of claim 1, further comprising sensing frequency components of another substrate to identify the frequency domain configuration to meet the one or more substrate processing metrics, wherein the one or more intermodulation or harmonic components corresponding to the frequency components.

3. The method of claim 1, wherein the frequency domain configuration comprises a ratio between magnitudes of at least two intermodulation or harmonic components.

4. The method of claim 1, wherein the one or more substrate processing metrics comprise process variation, etch rate, or uniformity associated with substrate processing.

5. The method of claim 1, further comprising constructing a pulsed voltage (PV) waveform based on the sensed one or more intermodulation or harmonic components, wherein the one or more signal processing devices are controlled based on the constructed PV waveform.

6. The method of claim 5, wherein the one or more signal processing devices comprises at least one of a PV waveform generator or a radio frequency (RF) generator controlled based on the constructed PV waveform.

7. The method of claim 1, wherein the node coupled to the plasma chamber comprises an output of the first match circuit.

8. The method of claim 7, wherein the node coupled to the plasma chamber is external to the first match circuit.

9. The method of claim 1, wherein controlling the one or more signal processing devices comprises controlling at least one of a magnitude or phase of one or more output signals of the one or more signal processing devices.

10. The method of claim 1, wherein the one or more signal processing devices comprise:

a second match circuit, wherein the one or more sensors comprises a sensor coupled to outputs of the first match circuit and the second match circuit.

11. The method of claim 10, wherein the one or more signal processing devices comprise:

a first generator having an output coupled to the first match circuit; and a second generator having an output coupled to the second match circuit, wherein the sensor is configured to provide a feedback signal to at least one of the first generator or the second generator.

12. An apparatus for processing a substrate in a plasma processing system, comprising:

one or more sensors configured to sense one or more intermodulation or harmonic components of a signal at a node coupled to a plasma chamber;

one or more signal processing devices coupled to the plasma chamber, wherein the one or more signal processing devices comprises a first match circuit; and a controller configured to control the one or more signal processing devices of the plasma processing system to process the substrate based on the one or more intermodulation or harmonic components and in accordance with a frequency domain configuration identified by analyzing one or more substrate processing metrics, and wherein to control the one or more signal processing devices, the controller is configured to control one or more impedances of the first match circuit based on the one or more intermodulation or harmonic components and in accordance with the frequency domain configuration.

13. The apparatus of claim 12, wherein the frequency domain configuration comprises a ratio between magnitudes of at least two intermodulation or harmonic components.

14. The apparatus of claim 12, wherein the one or more substrate processing metrics comprise process variation, etch rate, or uniformity associated with substrate processing.

15. The apparatus of claim 12, wherein the controller is further configured to construct a pulsed voltage (PV) waveform based on the sensed one or more intermodulation or harmonic components, wherein the one or more signal processing devices are controlled based on the constructed PV waveform.

16. The apparatus of claim 15, wherein the one or more signal processing devices comprises at least one of a PV waveform generator or a radio frequency (RF) generator configured to be controlled based on the constructed PV waveform.

17. The apparatus of claim 12, wherein the node coupled to the plasma chamber comprises an output of the first match circuit.

18. The apparatus of claim 17, wherein the node coupled to the plasma chamber is external to the first match circuit.

19. The apparatus of claim 12, wherein to control the one or more signal processing devices, the controller is configured to control at least one of a magnitude or phase of one or more output signals of the one or more signal processing devices.

20. The apparatus of claim 12, wherein the one or more signal processing devices comprise:

a second match circuit, wherein the one or more sensors comprises a sensor coupled to outputs of the first match circuit and the second match circuit.

21. A plasma processing system, comprising:

a plasma chamber;

one or more sensors configured to sense one or more intermodulation or harmonic components of a signal at a node coupled to the plasma chamber;

one or more signal processing devices coupled to the plasma chamber, wherein the one or more signal processing devices comprises a first match circuit; and a controller configured to control the one or more signal processing devices of the plasma processing system to process a substrate based on the one or more intermodulation or harmonic components and in accordance with a frequency domain configuration identified by analyzing one or more substrate processing metrics, and wherein to control the one or more signal processing devices, the controller is configured to control one or more impedances of the first match circuit based on the one or more intermodulation or harmonic components and in accordance with the frequency domain configuration.

* * * * *